(12) United States Patent
Nishimura et al.

(10) Patent No.: US 11,256,144 B2
(45) Date of Patent: Feb. 22, 2022

(54) DISPLAY DEVICE

(71) Applicant: Japan Display Inc., Tokyo (JP)

(72) Inventors: Masumi Nishimura, Tokyo (JP); Shinichiro Oka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/114,569

(22) Filed: Dec. 8, 2020

(65) Prior Publication Data

US 2021/0091336 A1 Mar. 25, 2021

Related U.S. Application Data

(63) Continuation of application No. 15/996,620, filed on Jun. 4, 2018, now Pat. No. 10,892,440.

(30) Foreign Application Priority Data

Jun. 29, 2017 (JP) .............................. JP2017-127062

(51) Int. Cl.
G02F 1/1339 (2006.01)
H01L 51/52 (2006.01)
G02F 1/1333 (2006.01)
H01L 27/32 (2006.01)
H01L 51/00 (2006.01)

(52) U.S. Cl.
CPC ...... *G02F 1/1339* (2013.01); *G02F 1/133305* (2013.01); *H01L 51/5246* (2013.01); *H01L 51/5253* (2013.01); *G02F 2201/50* (2013.01); *H01L 27/3244* (2013.01); *H01L 51/0097* (2013.01); *H01L 51/5281* (2013.01); *H01L 2251/5338* (2013.01)

(58) Field of Classification Search
CPC ............. H01L 51/5246; H01L 27/3244; H01L 51/0097; H01L 2251/5338; H01L 51/5281; H01L 51/5253; G02F 1/133305; G02F 1/1339; G02F 2201/50
See application file for complete search history.

(56) References Cited

U.S. PATENT DOCUMENTS

| | | | | |
|---|---|---|---|---|
| 4,470,668 A | * | 9/1984 | Inoue | G02F 1/1339 349/153 |
| 2009/0115942 A1 | * | 5/2009 | Watanabe | G02F 1/1339 349/96 |
| 2010/0208188 A1 | * | 8/2010 | Tsai | G02F 1/133305 349/153 |
| 2010/0225875 A1 | * | 9/2010 | Wang | G02F 1/1339 349/160 |
| 2017/0042047 A1 | * | 2/2017 | Oh | G09G 3/20 |
| 2018/0011514 A1 | * | 1/2018 | Yoo | G06F 1/1626 |
| 2018/0068598 A1 | * | 3/2018 | Kim | H01L 51/5253 |
| 2018/0217434 A1 | * | 8/2018 | Kawata | G02F 1/13452 |

* cited by examiner

*Primary Examiner* — Shan Liu
(74) *Attorney, Agent, or Firm* — Michael Best & Friedrich LLP (57) ABSTRACT

A display device includes a flexible substrate including a first region including a display region, a second region including a curved region, and a third region including a terminal region; an electro-optical element located in the display region; and a resin layer continuously extending from the first region to the third region.

5 Claims, 7 Drawing Sheets

DISPLAY DEVICE

CROSS-REFERENCE TO RELATED APPLICATIONS

This application is a continuation of U.S. patent application Ser. No. 15/996,620, filed on Jun. 4, 2018. Further, this application is based on and claims the benefit of priority from the prior Japanese Patent Application No. 2017-127062, filed on Jun. 29, 2017, the entire contents of which are incorporated herein by reference.

FIELD

The present invention relates to a display device, and specifically, a display device including a flexible substrate as a support substrate.

BACKGROUND

Recently, a sheet-like display device including a substrate that is flexible (hereinafter, referred to as a "flexible substrate") as a support substrate has been progressively developed, Such a display device including a flexible substrate is foldable, and has an advantage of, when being incorporated into a housing of a mobile terminal or the like, allowing a peripheral portion (bezel portion) of a display screen to be decreased in size.

Generally, a display region of a display device has various signal lines such as scanning signal lines, video signal lines and the like located therein. These signal lines extend to a terminal region located in the vicinity of the display device, and are connected with a flexible printed circuit board (FPC board). Therefore, a support substrate has a plurality of lines and the terminal region provided thereon in addition to the display region. For example, United States Patent Application Publication No. 2016/0172428 discloses a technology by which the display device is folded along a region between the display region and the terminal region and the terminal region is folded back toward a rear surface of the display region to decrease the size of the bezel portion of the display screen.

SUMMARY

A display device in an embodiment according to the present invention includes a flexible substrate including a first region including a display region, a second region including a curved region, and a third region including a terminal region; an electro-optical element located in the display region; and a resin layer continuously extending from the first region to the third region.

DESCRIPTION OF EMBODIMENTS

According to United States Patent Application Publication No. 2016/0172428, in the case where the display device is folded along the region between the display region and the terminal region, there occurs a problem that lines connecting the display region and the terminal region to each other are damaged and easily corroded. United States Patent Application Publication No. 2016/0172428 describes that in order to protect the lines, a protective film is provided on the curved region, along which the display device is folded. However, production of the structure described in United States Patent Application Publication No. 2016/0172428 requires an additional step of forming the protective film on the curved region, which increases the number of production steps.

One object of the present invention is to provide a display device protecting lines in such a folded portion with no additional production step.

Explanation of Embodiments

Hereinafter, embodiments of the present invention will be described with reference to the drawings and the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be or omitted.

In the specification and the claims, an expression that a first component is "on" (or "above" or "below") a second component encompasses a case where the first component is in contact with the second component and also a case where the first component is above or below the second component, namely, a case where still another component is provided between the first component and the second component, unless otherwise specified.

In the specification and the claims, the terms "on", "above", "upward", "below", "downward" and the like each represent a relative positional relationship between the component of interest and another component with respect to a surface of a substrate on which an electro-optical element is formed (hereinafter, referred to simply as a "surface). For example, in this specification, a direction from the surface of the substrate toward the electro-optical element is represented by the term "on", "above" or "upward", and an opposite direction thereto is represented by "below" or "downward.

A "display device" refers to a structural body that displays a video by use of an electro-optical layer. For example, the "display device" may refer to a display cell including an electro-optical layer or may refer to a structural body including the display cell and another optical member (e.g., polarizing member, backlight unit, touch panel, etc.) attached to the display cell. The "electro-optical layer" may encompass a liquid crystal layer, an electroluminescence (EL) layer, an electrochromic (EC) layer and an electrophoretic layer, unless any technological contradiction occurs. In the following embodiments, an organic EL display device including an organic EL layer and a liquid crystal display device including a liquid crystal layer will be described as examples of display device. Nonetheless, the present n is also applicable to any other type of display device including any electro-optical layer as described above.

Embodiment 1

<Structure of the Display Device>

In this embodiment, an organic EL display device will be described as an example of display device. The "organic EL display device" is a display device using an organic EL display element as an electro-optical element.

Figure 1:
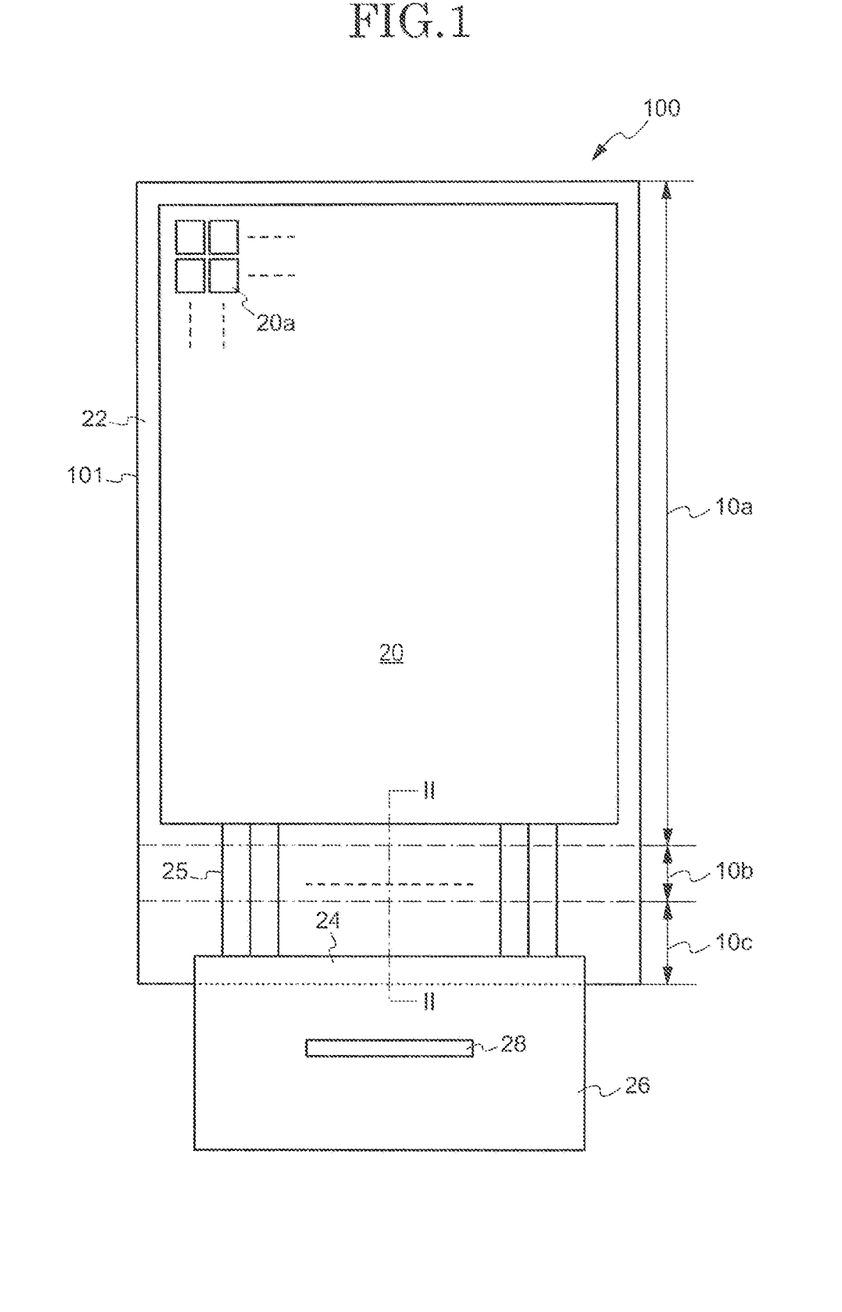
FIG. 1 is a plan view showing a structure of an organic EL display device in embodiment 1.

FIG. 1 is a plan view showing a structure of an organic EL display device 100 in embodiment 1. Referring to FIG. 1, an array substrate 101 includes a plurality of pixels 20a each including an organic EL element 60 (see FIG. 4) formed on a surface of a support substrate (not shown). The array substrate 101 may be referred to also as an "active matrix substrate". In this specification, the array substrate 101 will be described as being separated into three regions, namely, a first region 10a, a second region 10b and a third substrate 10c for the sake of convenience.

FIG. 1 shows the first region 10a, the second region 10b and the third region 10c as being continuous to each other on one same plane. In the environment of actual use, the second region 10b is curved, so that the first region 10a and the third region 10c overlap each other as seen in a plan view. FIG. 1 shows a state where the second region 10b is not curved for the sake of convenience.

The first region 10a includes a display region 20 and a peripheral region 22. In the display region 20, the plurality of pixels 20a each including an organic EL element 60 are located. In the peripheral region 22, circuits (e.g., a shift register circuit and the like) transmitting signals to the pixels 20a are located. In this embodiment, there is no specific limitation on the type of circuits located in the peripheral region 22.

The second region 10b includes a curved region along which a terminal region 24 of the organic EL display device 100 is folded back toward a rear surface of the array substrate 101. As described above, in the environment of actual use, the second region 10b is curved, so that the first region 10a and the third region 10c overlap each other as seen in a plan view.

The third region 10c includes the terminal region 24. In the terminal region 24, a plurality of lines 25 are located in a concentrated manner, and the lines 25 are electrically connected with a flexible printed circuit board 26. A signal (e.g., video signal) transmitted from an external device via the flexible printed circuit board 26 is transmitted to the display region 20 via the plurality of lines 25 extending from the terminal region 24.

In this embodiment, a driving circuit 28 including an IC chip or the like is mounted on the flexible printed circuit board 26. The driving circuit 28 plays a role of transmitting a control signal such as a start pulse of the like to the shift register circuit or the like located in the peripheral region 22 or of performing predetermined signal processing on the video signal. The driving circuit 28 is not indispensable, and may be omitted. The driving circuit 28 may be located in the third region 10c.

Figure 2:
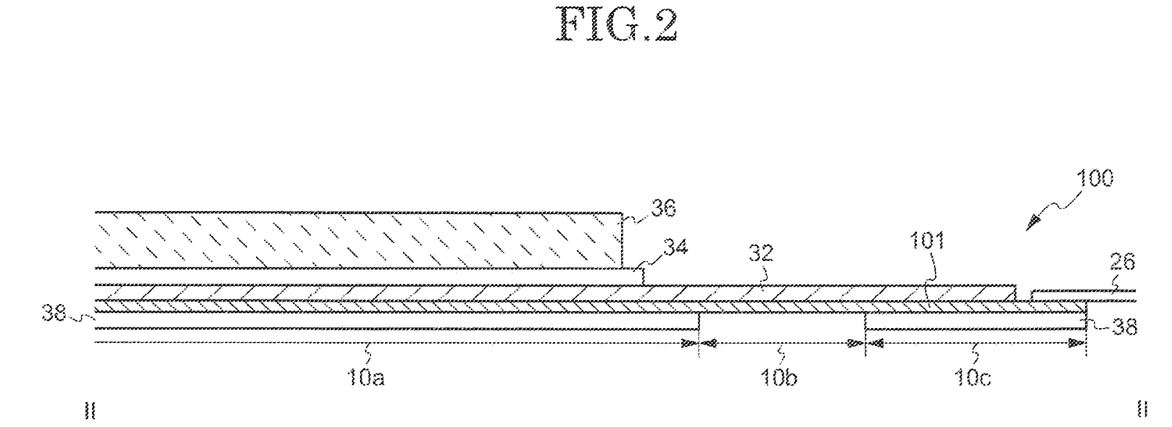
FIG. 2 is a cross-sectional view showing a structure of the organic EL display device in embodiment 1.

Now, a cross-sectional structure of the organic EL display device 100 shown in FIG. 1 taken along one-dot chain line II-II as shown in FIG. 2 will be described.

FIG. 2 is a cross-sectional view showing a structure of the organic EL display device 100 in embodiment 1. FIG. 2 specifically shows a structure of the second region 10b and the vicinity thereof. A first protective film 34 is bonded to a surface of the array substrate 101 with an adhesive 32 formed of a resin material. In this embodiment, the adhesive 32 is formed of an ultraviolet-curable resin material. It is preferred that the first protective film 34 is formed of an optical transparent film of an organic material such as cycloolefin polymer (COP), triacetylcellulose (TAO), cycloolefin copolymer (COC) or the like.

On the first protective film 34, a polarizing member 36 is located. The polarizing member 36 is bonded to the first protective film 34 with an adhesive (not shown). Below a rear surface of the array substrate 101, a second protective film 38 is located. The second protective film 38 is bonded to the rear surface of the array substrate 101 with an adhesive, like the first protective film 34, but the adhesive is not shown. It is preferred that the second protective film 38 is formed of a film of an organic material such as polyethyleneterephthalate (PET) or the like.

The first protective film 34 may also be referred to as a "laminate film", and has a role of protecting the display region 20. The first protective film 34 may be any known protective film.

The polarizing member 36 transmits only light or waves polarized in a specific direction. Such a polarizing member is usually referred to as a "polarizing plate" or a "polarizing film". In this embodiment, the polarizing member 36 is a circularly polarizing film. Use of a circularly polarizing film as the polarizing member 36 decreases the reflectance and suppresses, for example, an image of an observer from appearing on the display screen.

Like the first protective film 34, the second protective film 38 has a role of protecting the display region 20. Therefore, the second protective film 38 is located below the rear surface of the array substrate 101 (surface opposite to the surface on which the adhesive 32 is located). The second protective film 38 may be any known protective film.

In this embodiment, the second protective film 38 is not located in the second region 10b. Namely, the second protective film 38 is divided at the second region 10b. Such a structure makes it easy to curve the second region 10b.

As shown in FIG. 2, in this embodiment, the adhesive 32 continuously extends from the first region 10a to the third region 10c. Namely, the adhesive 32 is provided to cover the second region 10b including the curved region. Therefore, the adhesive 32 bonding the first protective film 34 to the array substrate 101 also acts as a protective film or the second region 10b and the third region 10c.

Such a structure is realized by applying the adhesive 32 also to the second region 10b and the third region 10c when the first protective film 34 is bonded to the array substrate 101 with the adhesive 32.

Figure 3:
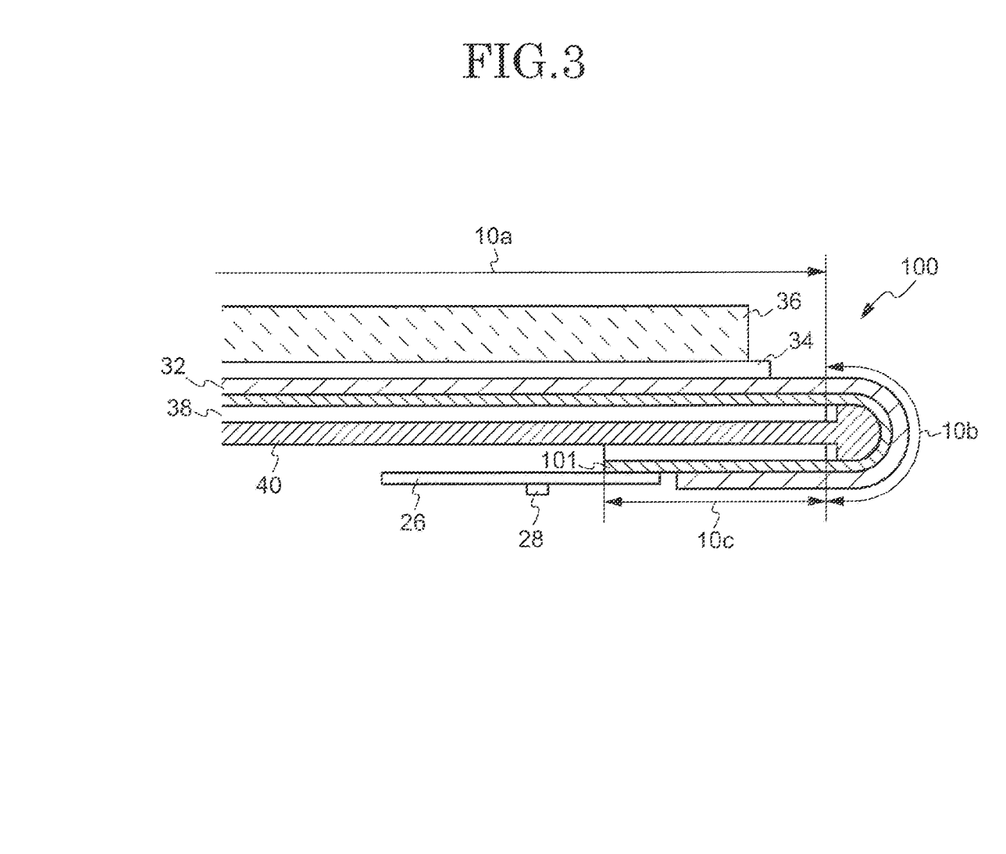
FIG. 3 is a cross-sectional view showing a structure of the organic EL display device in embodiment 1.

FIG. 3 is a cross-sectional view showing a structure of the organic EL display device 100 in embodiment 1. Specifically, FIG. 3 shows a state where the organic EL display device 100 is folded. As shown in FIG. 3, in the environment of actual use of the organic EL display device 100 in this embodiment, the second region 10b is curved, and the first region 10a and the third region 10c overlap each other as seen in a plan view. In this embodiment, a spacer 40 is located between the first region 10a and the third region 10c. A portion of the spacer 40 that is in contact with the second region 10b has a curved surface conformed to the shape of the second region 10b.

In this state, the plurality of lines 25 connecting the display region 20 and the terminal region 24 receive a heavy load by the curving of the second region 10b. Conventionally, a protective film is provided on the curved region to decrease the damage of the lines 25. This requires an extra production step of forming the protective film. The organic EL display device 100 in this embodiment uses the adhesive 32, used to bond the first protective film 34, also as a protective film for the second region 10b. Thus, the lines 25 in the curved region is protected with no additional production step.

FIG. 2 and FIG. 3 show a structure in which the first protective film 34 is bonded to the array substrate 101 and the polarizing member 36 is bonded to the first protective film. The first protective film 34 may be omitted. Namely, the polarizing member 36 may be directly bonded to the array substrate 101.

<Structure of the Pixel>

Now, a structure of the pixels 20a of the organic EL display device 100 in this embodiment will be described. The pixels 20a shown in FIG. 1 actually each include three sub pixels respectively corresponding to the three RGB colors. Herein, one sub pixel will be described for the sake of convenience. In the following, the sub pixel may be referred to as the "pixel" for the sake of convenience.

Figure 4:
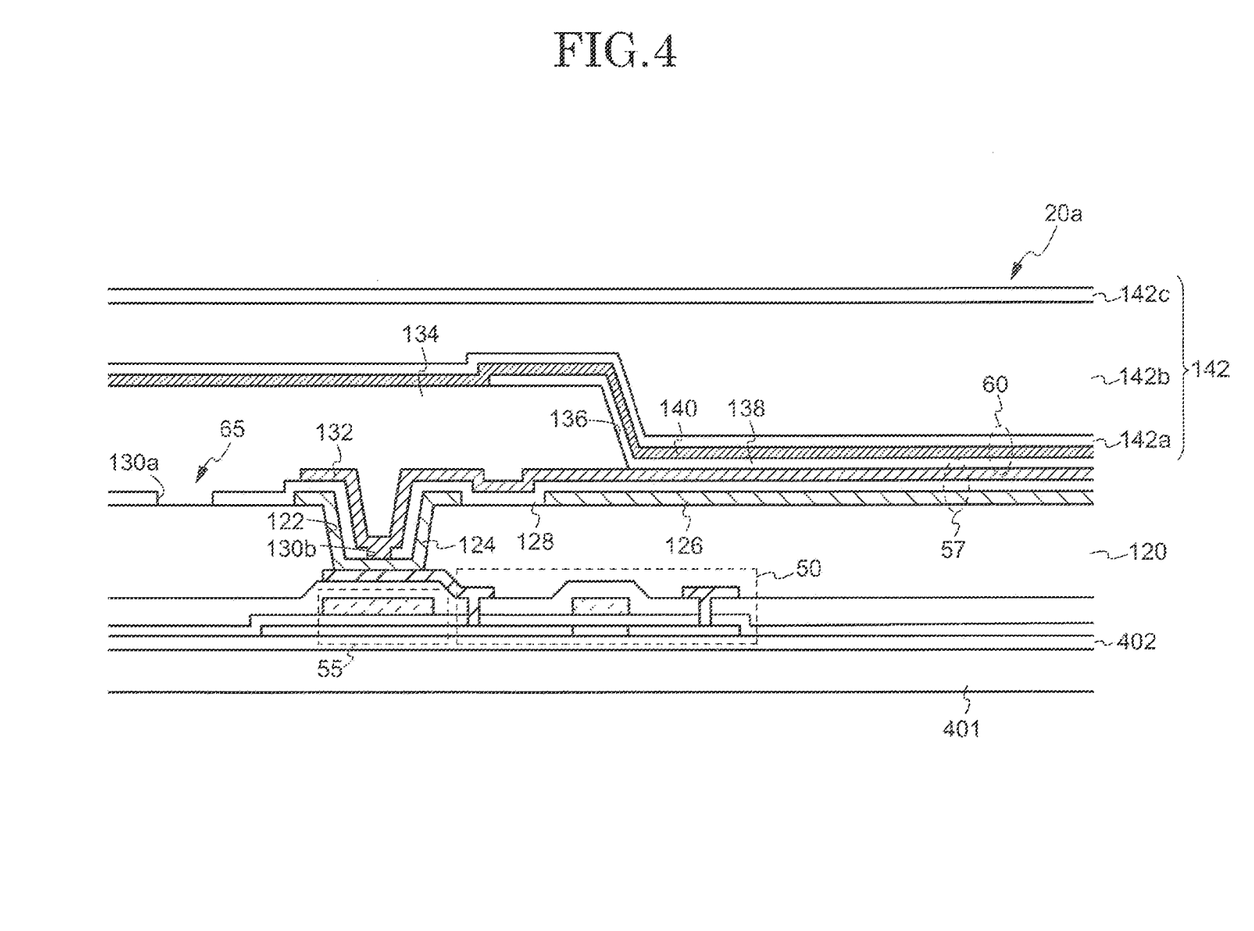
FIG. 4 is a cross-sectional view showing a structure of a pixel of the organic EL display device in embodiment 1.

FIG. 4 is a cross-sectional view showing a structure of the pixel 20a of the organic EL display device 100 in embodiment 1. As shown in FIG. 4, a thin film transistor 50 is provided on a resin substrate 401 with an underlying film 402 being located between the resin substrate 401 and the thin film transistor 50. In this embodiment, the resin substrate 401 is formed of a resin material such as acrylic resin, polyimide resin or the like. The underlying film 402 is formed of an inorganic insulating film such as a silicon oxide film or the like. In this embodiment, the resin substrate 401 is used as the support substrate of the array substrate 101. Therefore, the array substrate 101 is flexible. Thus, in this embodiment, the array substrate 101 may be referred to also as a "flexible substrate".

The thin film transistor 50 is a so-called top gate-type thin film transistor. The thin film transistor 50 is not limited to this, and any type of thin film transistor is usable instead of the top gate-type thin film transistor. The thin film transistor 50 shown in FIG. 4 acts as a driving transistor that supplies an electric current to the organic EL element 60. In this embodiment, the thin film transistor 50 is an N-channel transistor. The thin film transistor 50 has a known structure, which is not described herein in detail.

The thin film transistor 50 is connected with a storage capacitance 55. The storage capacitance 55 may include any two conductive films among conductive films included in the thin film transistor 50 and an insulating film provided between the two conductive films. The storage capacitance 55 in this embodiment specifically includes a semiconductor layer forming an active layer of the thin film transistor 50, a gate insulating film, and a source electrode. The structure of the storage capacitance 55 is not limited to this.

The thin film transistor 50 is covered with an organic insulating film 120. The organic insulating film 120 also acts as a flattening film that compensates for roughness caused by the thin film transistor 50 to provide a flat surface. In this embodiment, the organic insulating film 120 is an insulating film containing a resin material such as acrylic resin, polyimide resin or the like.

The organic insulating film 120 has an opening 122 formed therein. The opening 122 is covered with an organic conductive film 124. In this embodiment, the organic conductive film 124 is a patterned thin film formed of a metal oxide material such as ITO (Indium Tin Oxide) or the like. The organic conductive film 124 is not limited to being formed of such a material, and may be formed of any other oxide conductive film. The organic conductive film 124 is connected with a part of the thin film transistor 50 exposed by the opening 122 (the part is, specifically, the source electrode).

On a top surface of the organic insulating film 120, a lower electrode 126, of a storage capacitance 57, formed of an oxide conductive film is provided. The lower electrode 126 is formed in the same step as that of the organic conductive film 124. The lower electrode 126 is provided below the organic EL element 60. As described below, the organic EL element 60 in this embodiment configured to output light upward. Therefore, a space below the organic EL element 60 is usable to form the storage capacitance 57.

Although not shown in FIG. 4, the oxide conductive film used to form the oxide conductive film 124 and the lower electrode 126 of the storage capacitance 57 may also be used for another use (e.g., to form a line). In such a case, a metal film may be provided on the oxide conductive film used to form the line, so that the line resistance may be decreased. An oxide conductive film formed of a metal oxide has a higher resistance than that of a metal film. Therefore, in the case where such an oxide conductive film is used to form a line, it is preferred that a metal film is provided thereon to decrease the resistance of the assembly of the oxide conductive film and the metal film. In this case, the oxide conductive film 124 also acts as a protective film that protects the source electrode of the thin film transistor 50 against etching gas used to form the metal film.

On the oxide conductive film 124 and the lower electrode 126, an inorganic insulating film 126 is provided. In this embodiment, the inorganic insulating film 128 is formed of a silicon nitride film. The inorganic insulating film 128 is not limited to this, and may be formed of any other inorganic insulating film such as a silicon oxide film or the like. The inorganic insulating film 128 has an opening 130a formed therein, which exposes the organic insulating film 120. The opening 130a acts as a water releasing region 65. The water releasing region 65 plays a role of releasing moisture or the like generated from the organic insulating film 120 in a heating step performed after the organic insulating film 120 is formed.

On the inorganic insulating film 128, a pixel electrode 132 is provided. The pixel electrode 132 is connected with the oxide conductive film 124 via an opening 130b provided in the inorganic insulating film 128. Namely, the pixel electrode 132 is connected with the thin film transistor 50 via the oxide conductive film 124. The pixel electrode 132 acts as an upper electrode of the storage capacitance 57 and also acts as an anode electrode of the organic EL element 60.

In this embodiment, the pixel electrode 132 is formed of a conductive film having a stack structure including oxide conductive films of ITO or the like and a thin film containing silver held between the oxide conductive films. The pixel electrode 132 is not limited to having such a structure. In order to allow light emitted from the organic EL element 60 to be output upward, it is preferred that the pixel electrode 132 includes a reflective conductive film.

In this embodiment, the dielectric material of the storage capacitance 57 is the silicon nitride film having a higher dielectric constant than that of the other insulating films. This provides an advantage that the storage capacitance 57 has an advantage of having a large capacitance easily. In addition, the space below the organic EL element 60 is effectively used to locate the storage capacitance 57, which provides an advantage that the area size of the storage capacitance 57 is made large easily.

The pixel electrode 132 is partially covered with a bank 134 formed of an organic material. Specifically, the bank 134 covers an end portion of the pixel electrode 132, and has an opening 136 exposing a part of a top surface of the pixel electrode 132. The part of the top surface of the pixel electrode 132 thus exposed is substantially a light emitting region of the pixel 20a. Namely, the bank 134 plays a role of defining the light emitting region of the pixel 20a. The organic material used to form the bank 134 may be a resin material such as an acrylic resin, a polyimide resin or the like, but is not limited to any of these.

On a region e top surface of the pixel electrode 132 that does not overlap the bank (namely, a region in the opening 136), an organic EL layer 138 is provided. In this embodiment, the organic EL layer 138 is formed by vapor deposition of an organic EL material. The organic EL layer 138 includes at least a light emitting layer (not shown), and may also include an electron injection layer, an electron transfer layer, an electron blocking layer, a hole injection layer, a hole transfer layer and/or a hole blocking layer. The organic EL layer 138 may be formed of an organic EL material that emits light of at least, for example, red, blue or green.

In this embodiment, the light emitting layer emits light of a different color on a pixel-by-pixel basis, for example. The light emitting layer is not limited to this. For example, an organic EL layer emitting white light may be provided in each of a plurality of pixels, although such a structure is not shown. In this case, the white light is provided with any color of the RGB colors by a color filter provided in each pixel. The functional layer(s) such as the electron injection layer, the electron transfer layer, the electron blocking layer, the hole injection layer, the hole transfer layer and/or the hole blocking layer may be provided across a plurality of pixels.

On the organic EL layer 138, a common electrode 140 formed of a conductive film containing an alkaline metal material is provided. The alkaline metal material may be, for example, magnesium (Mg), lithium (Li) or the like. In this embodiment, a film of MgAg, which is an alloy of magnesium and silver, is used as the conductive film containing an alkaline metal material. The common electrode 140 acts as a cathode electrode of the organic EL element 60. The common electrode 140 is provided across a plurality of pixels.

In the case where the organic EL display device 100 is of a top emission type, in which the light from the organic EL element 60 is output upward, namely, output through the common electrode 140, the common electrode 140 needs to be light-transmissive. In the case where the common electrode 140 is formed of a conductive film containing an alkaline metal material as described above, the common electrode 140 is made light-transmissive by being thinned sufficiently to transmit the light. Specifically, the thickness of the common electrode 140 may be 10 nm or greater and 30 nm or less to be light-transmissive.

On the common electrode 140, a sealing film 142 is provided. The sealing film 142 in this embodiment includes three layers, specifically, a first sealing film 142a formed of an inorganic material, a second sealing film 142b formed of an organic material, and a third sealing film 142c formed of an inorganic material sequentially from the lowest layer. These sealing films play a role of preventing entrance of moisture or the like from outside to prevent deterioration of the organic EL layer 138 and the common electrode 140.

In this embodiment, the first sealing film 142a and the third sealing film 142c are each formed of a silicon nitride film. The first sealing film 142a and the third sealing film 142c are not limited to this, and may be formed of a silicon oxide film instead. Namely, the first sealing film 142a and the third sealing film 142c may be each formed of an organic insulating film. It is especially preferred that the organic insulating film contains a silicon nitride.

The second sealing film 142b is an organic insulating film formed of a resin material. In this embodiment, an organic insulating film formed of a resin material is used as the second sealing film 142b, so that roughness caused by the bank 134 is compensated for and a flat surface is provided. The first sealing film 142a, which has a thickness of about 1 μm, is formed along an inclining surface of the bank 134. By contrast, the second sealing film 142b, which has a thickness of about 10 μm, is sufficient to fill the opening 136 provided in the bank 134. Therefore, use of an organic insulating film as the second sealing film 142b allows roughness at a top surface of the second sealing film 142b to be smaller than roughness at a top surface of the first sealing film 142a.

<Structure of the End Portion and the Vicinity of the Display Region>

Now, a specific structure of an end portion and the vicinity of the display region 20 will be described. More specifically, a structure of the adhesive 32 in the region bridging the first region 10a and the second region 10b shown in FIG. 1 will be described.

Figure 5:
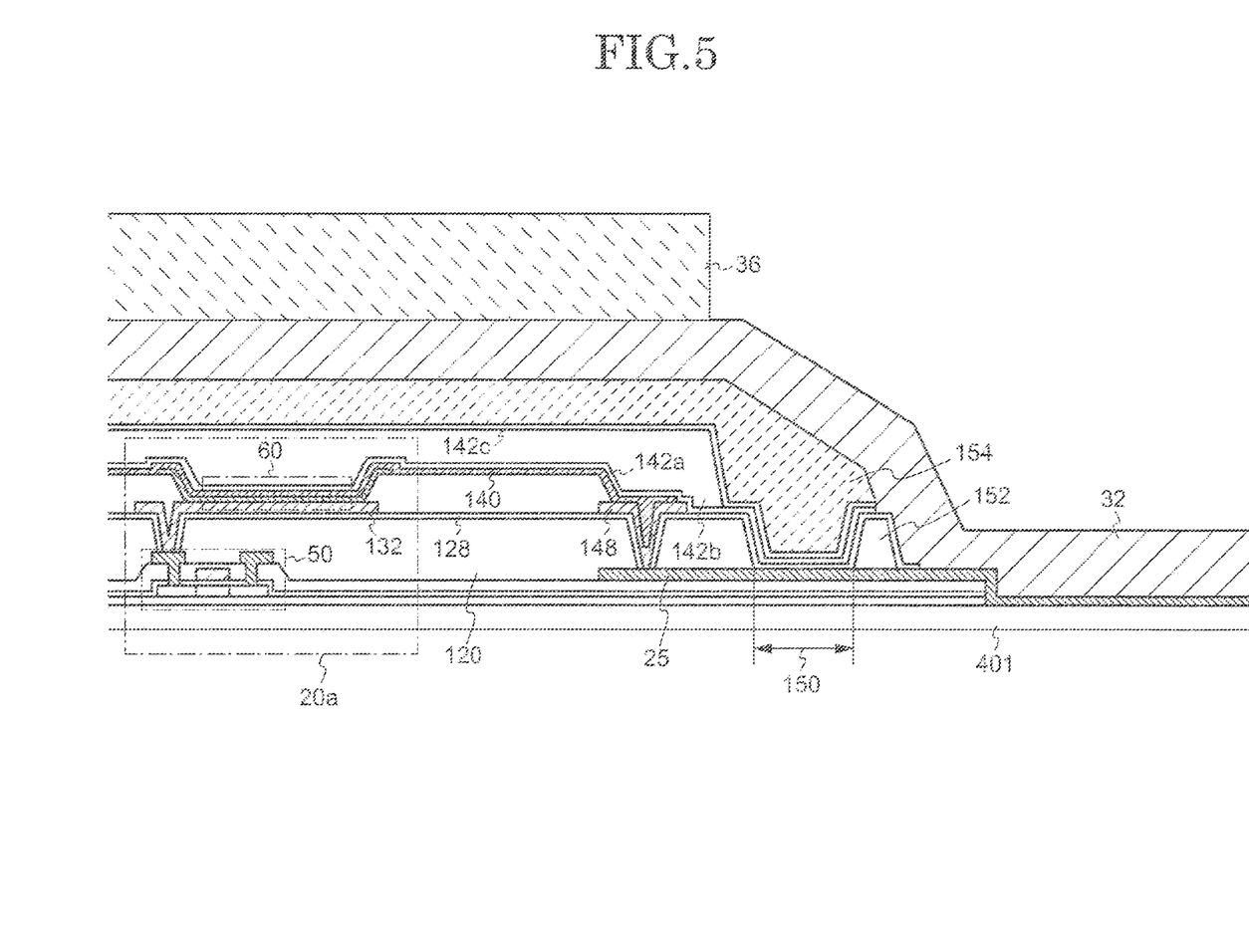
FIG. 5 is a cross-sectional view showing a structure of an end portion and the vicinity thereof of a display region of the organic EL display device in embodiment 1.

FIG. 5 is a cross-sectional view showing a structure of the end portion and the vicinity thereof of the display region 20 of the organic EL display device 100 in embodiment 1. As described above, the pixel 20a includes the thin film transistor 50 and the organic EL element 60. The detailed structure of the pixel 20a are as described above with reference to FIG. 4. The common electrode 140 acting as the cathode electrode of the organic EL element 60 is electrically connected with the lines 25 in the vicinity of the display region 20. Although not shown in FIG. 5, the plurality of lines 25 are arrayed side by side in a depth direction of the sheet of FIG. 5 as can be understood from FIG. 1.

In this embodiment, the common electrode 140 is electrically connected with the lines 25 via a connection electrode 148. The connection electrode 148 may be formed of an oxide conductive film, like the pixel electrode 132. Specifically, the connection electrode 148 may be formed in the same step as that of the pixel electrode 132.

As shown in FIG. 5, neither the organic insulating film 120 nor the second sealing film 142b is provided in a region 150 outer to the connection electrode 148 (outside on the side where the second region 120b is located). Therefore, in the region 150, a stack structure of the inorganic insulating film 128, the first sealing film 142a and the third sealing film 142c is provided. Thus, entrance of the moisture or the like from outside via the organic material is suppressed.

Outer to the region 150, a protruding portion 152 formed in the same step as that of the organic insulating film 120 is located. In a step of forming a mask insulating film 154, the protruding portion 152 acts as a bank that stops expansion of a resin material. The mask insulating film 154 is formed by the resin material dripped to the center or the vicinity thereof of the display region 20 being expanded externally and then cured. At this point, the protruding portion 152 plays a role of stopping the expansion of the resin material.

The first sealing film 142a and the second sealing film 142b are removed from the second region 10b and the third region 10c by etching in order to expose the lines 25 in the terminal region 24. In the step of etching performed to remove the first sealing film 142a and the second sealing film 142b, the mask insulating film 154 acts as a mask. In this embodiment, the mask insulating film 154 extends to a position above the protruding portion 152. Therefore, ends of the first sealing film 142a and the second sealing film 142b are also located above the protruding portion 152. The time duration of the etching may be controlled such that the inorganic insulating film 128 is left as in this embodiment.

The adhesive 32 is provided on the mask insulating film 154. In this embodiment, the polarizing member 36 is bonded to the mask information film 154 with the adhesive 32. As described above, the adhesive 32 extends continuously from the first region 10a to the third region 10c. As shown in FIG. 5, the adhesive 32 is provided continuously from the first region 10a to the third region 10c while covering the end portion and the vicinity of the display region 20. The adhesive 32 may have a thickness greater than that of a resin substrate 401.

The thickness of the adhesive 32 may be set to any value. Basically, the adhesive 32 is less hard, less rigid and less elastic than the resin substrate 401. In order to allow a neutral surface to be located in, or in the vicinity of, the lines, the inorganic insulating film or the like located in the second region 10b when the second region 10b is folded, it is preferred that the adhesive 32 is thicker than the resin substrate 401 in consideration of the above-described elasticity or the like. Therefore, in this embodiment, the adhesive 32 is thicker than the resin substrate 401.

As described above, in the organic EL display device 100 in this embodiment, the adhesive 32 used to bond the first protective film 34 or the polarizing member 36 located on the display region 20 is provided in the first region 10a and extends to the third region 10c from the first region 10a. With such a structure, the curved region included in the second region 10b is covered with the adhesive 32 formed of a resin material with no additional production step. Thus, the lines 25 are protected in the curved region by such a simple method.

In this embodiment, an ultraviolet-curable resin material is used as the adhesive 32. Namely, the ultraviolet rays may be directed to polymerize and thus cure a monomer in the resin material. For example, the adhesive 32 may be irradiated with ultraviolet rays in the state where the second region 10b is curved as shown in FIG. 3, so that the adhesive 32 is cured while the second region 10b is kept curved. This is merely an example, and does not eliminate use of a thermosetting resin material as the adhesive 32.

In the case where an ultraviolet-curable resin material is used as the adhesive 32, it is preferred that the ultraviolet-curable resin material is curable by ultraviolet rays in a wavelength range that does not damage the organic EL layer 138. In the case where such an ultraviolet-curable resin material is not used, it is preferred that the display region 20 is not irradiated with ultraviolet rays in consideration of the damage to the organic EL layer 138. Namely, it is preferred that the ultraviolet rays are locally directed to the second region 10b to selectively cure the adhesive 32. In this case, the portion of the adhesive 32 irradiated with the ultraviolet rays is polymerized, and therefore, the degree of polymerization of the resin material in this region is increased. Namely, in the case where the adhesive 32 is selectively cured, a portion of the adhesive 32 in the curved region (in the second region 10b) has a higher degree of polymerization than that of a portion of the adhesive 32 in the display region 20.

It is preferred that a region outer to the display region 20 (namely, a part of the first region 10a, the entirety of the second region 10b and the entirety of the third region 10c) is cured by ultraviolet rays, for the following reason. In the case where a border between the above-described region having a high degree of polymerization and a region having a low degree of polymerization is outer to the end of the first protective film 34, the adhesive 32 may possibly be broken from the border.

In this embodiment, the adhesive 32 is continuously formed across the end of the first protective film 34, without being changed in the material or state. Therefore, in the case where the adhesive 32 and an organic film that maintains the neutral surface are formed separately, a problem that the organic film is delaminated at the border of the adhesive 32 and the organic film is avoided.

Embodiment 2

In this embodiment, liquid crystal display device will be described as an example of display device. The liquid crystal display device uses a liquid crystal element as the electro-optical element. In this embodiment, components same as those in the organic EL display device 100 in embodiment 1 will bear the same reference numerals therewith and descriptions thereof may be omitted.

Figure 6:
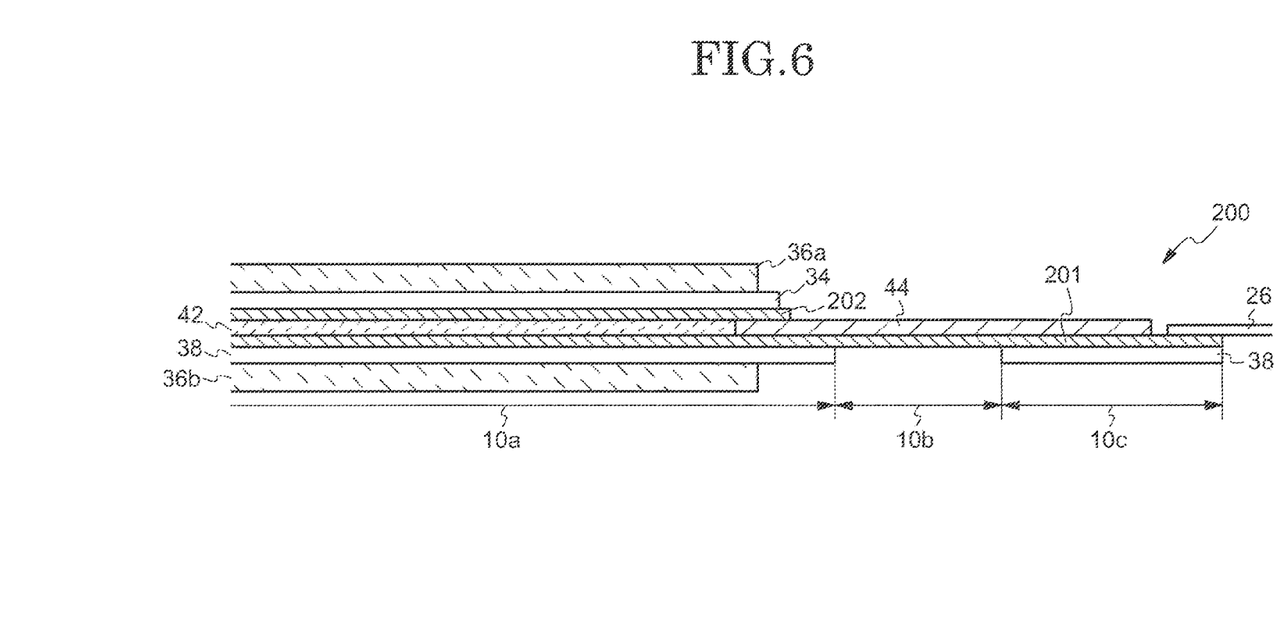
FIG. 6 is a cross-sectional view showing a structure of a liquid crystal display device in embodiment 2.

FIG. 6 is a cross-sectional view showing a structure of a liquid crystal display device 200 in embodiment 2. On the surface of an array substrate 201, a counter substrate 202 is provided with a liquid crystal layer 42 being located between the array substrate 201 and the counter substrate 202. The liquid crystal layer 42 is enclosed by a sealing member 44 and sealed between the array substrate 201 and the counter substrate 202. In this embodiment, the sealing member 44 is provided to enclose the display region 20 and also the second region 10b. Namely, the sealing member 44 continuously extends from the first region 10a to the third region 10c. Therefore, the sealing member 44 formed of a resin material acts as a resin layer protecting the second region 10b and also is in contact with the liquid crystal layer 42 included in the liquid crystal element.

The structure shown in FIG. 6 is realized as follows. In the step of forming the sealing 44 by use of a dispenser or like, a resin material forming the sealing member 44 is also applied to the second region 10b and the third region 10c. Specifically, first, the dispenser is moved to enclose the display region 20 to form a member that seals the liquid crystal layer 42. Then, the dispenser is scanned from the display region 20 to the third region 10b to form a thin film formed of a resin material.

The sealing member 44 may be formed of an ultraviolet-curable resin material or a thermosetting resin material. Alternatively, a resin material curable by both of ultraviolet rays and heat may be used. In either case, in this embodiment, the sealing member 44 acts as a member that seals the liquid crystal layer 42 and also as a protective member for the curved region. Therefore, the second region 10b including the curved region is protected by the resin layer approximately as thick as the liquid crystal layer 42.

The first protective film 34 is bonded to the counter substrate 202 with an adhesive (not shown). A first polarizing member 36a is bonded to the first protective film 34 with an adhesive (not shown). Below the rear surface of the array substrate 201, the second protective film 38 is located. The second protective film 38 is bonded to the rear surface of the array substrate 201 with the adhesive, like the first protective film 34. A second polarizing member 36b is bonded to the second protective film 38 with an adhesive (not shown). The first polarizing member 36a and the second polarizing member 36b are located in a crossed Nichols state.

Figure 7:
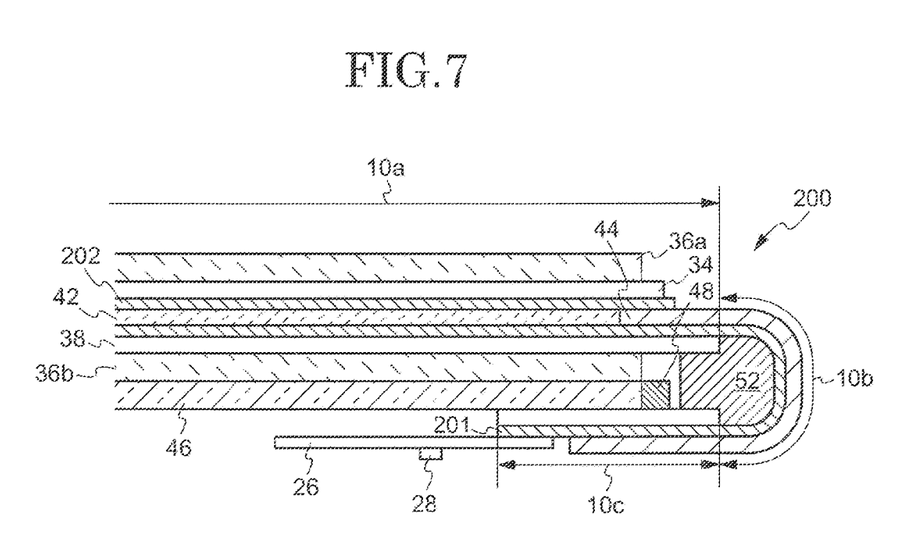
FIG. 7 is a cross-sectional view showing a structure of the liquid crystal display device in embodiment 2.

FIG. 7 is a cross-sectional view showing a structure of the liquid crystal display device 200 in embodiment 2. Specifically, FIG. 7 shows a state where the liquid crystal display device 200 is curved. As shown in FIG. 7, in the environment of use of the liquid crystal display device 200 in this embodiment, the second region 10b is curved, and the first region 10b and the third region 10c overlap each other as seen in a plan view.

As shown in FIG. 7, the liquid crystal display device 200 in this embodiment includes a light guide plate 46 located adjacent to the second polarizing member 36b. A light source 48 formed of an LED lamp or the like is located at a side surface of the light guide plate 46. An optical component including the light guide plate 46 and the light source 48 may be referred to as a "backlight unit".

In this embodiment, in the state where the second region 10b is curved, the third region 10c and the light guide plate 46 overlap each other as seen in a plan view. Namely, in the liquid crystal display device 200 in this embodiment, the second polarizing member 36b and the light guide plate 46 are located between the first region 10a and the third region 10c. Such a structure allows the liquid crystal display device 200 to be compact.

In this embodiment, a spacer 52 is located at a position corresponding to the second region 10b (i.e., at the curved portion). A portion of the spacer 52 that is in contact with the second region 10b is curved so as to be conformed to the shape of the second region 10b. A part of the spacer 52 is located between the first region 10a and the third region 10c.

In the liquid crystal display device 200 in this embodiment, the sealing member 44 used to seal the liquid crystal layer 42 is also used as a protective film for the second region 10b. Therefore, the lines in the curved region are protected with no additional production step.

FIG. 6 and FIG. 7 show a structure in which the first protective film 34 is bonded to the counter substrate 202 and the first polarizing member 36a is bonded to the first protective film 34. The first protective film 34 may be omitted. Namely, the first polarizing member 36a may be directly bonded to the counter substrate 202. Similarly, the second protective film 38 may be omitted, and the second polarizing member 36b may be directly bonded to the array substrate 201.

Embodiment 3

In each of the above-described embodiments, the array substrate 101 (or the array substrate 201) is curved along a region between the display region 20 and the terminal region 24. The present invention is not limited to this. For example, in the case where, as shown in FIG. 1, the terminal region 24 is located below the display region 20, the array substrate 101 (or the array substrate 201) may be curved along a portion parallel to a left side, a right side or a top side thereof according to the present invention.

The present invention is applicable to a display device that may be folded along a portion in the display screen, like a foldable display device. For example, two or four display regions each enclosed by a sealing member may be formed on a resin substrate, and one display screen may be formed of such a plurality of display regions. In this case, the array substrate may be curved along the portion between the plurality of display regions. The sealing member may extend on the curved region to act as a protective film.

The above-described embodiments according to the present invention may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being located by the present invention.

What is claimed is:

1. A display device, comprising:
    a flexible substrate including a first region including a display region, a second region including a curved region, and a third region including a terminal region;
    an electro-optical element located in the display region; and
    a resin layer continuously extending from the first region to the third region, wherein
    the electro-optical element is a liquid crystal element,
    a side surface of the resin layer is in contact with a liquid crystal layer included in the liquid crystal element and the resin layer is a sealing member enclosing the liquid crystal layer,
    the liquid crystal element has a counter substrate located on the liquid crystal layer,
    the resin layer has a first area overlapping the counter substrate in a plan view and a second area in the curved region and not overlapping the counter substrate in the plan view, and
    entire thickness of the resin layer in the curved region is thicker than the flexible substrate and thinner than the combined thickness of the liquid crystal layer and the counter substrate.

2. The display device according to claim 1, wherein the resin layer is approximately as thick as the liquid crystal layer.

3. The display device according to claim 1, further comprising a protective film or a polarizing member on the liquid crystal layer,
    wherein a part of the resin layer overlaps the protective film or the polarizing member as seen in a plan view.

4. The display device according to claim 1, wherein the resin layer covers the curved region.

5. The display device according to claim 1, further comprising a protective film divided at the curved region, the protective film being provided below a surface of the flexible substrate opposite to a surface on which the resin layer is located.

* * * * *